(12) United States Patent
Roine et al.

(10) Patent No.: US 9,384,826 B2
(45) Date of Patent: Jul. 5, 2016

(54) CIRCUITS AND METHODS FOR PERFORMANCE OPTIMIZATION OF SRAM MEMORY

(71) Applicant: Texas Instruments Incorporated, Dallas, TX (US)

(72) Inventors: Per Torstein Roine, Oslo (NO); Vinod Menezes, Bangalore (IN); Mahesh Mehendale, Karnataka (IN); Vamsi Gullapalli, Karnataka (IN); Premkumar Seetharaman, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/562,056

(22) Filed: Dec. 5, 2014

(65) Prior Publication Data
US 2016/0163379 A1  Jun. 9, 2016

(51) Int. Cl.
| | |
|---|---|
| *G11C 7/12* | (2006.01) |
| *G11C 11/419* | (2006.01) |
| *G11C 11/418* | (2006.01) |
| *G11C 11/4094* | (2006.01) |
| *G11C 11/412* | (2006.01) |

(52) U.S. Cl.
CPC .......... *G11C 11/419* (2013.01); *G11C 11/4094* (2013.01); *G11C 11/418* (2013.01); *G11C 11/412* (2013.01)

(58) Field of Classification Search
CPC ....................................................... G11C 7/12
USPC ........................................................ 365/203
See application file for complete search history.

(56) References Cited

U.S. PATENT DOCUMENTS

| | | | | |
|---|---|---|---|---|
| 4,893,278 A | * | 1/1990 | Ito ......................... | G11C 11/419 365/190 |
| 5,600,601 A | * | 2/1997 | Murakami ............... | G11C 7/12 365/203 |
| 5,659,515 A | * | 8/1997 | Matsuo ................. | G11C 11/406 365/222 |
| 5,781,469 A | * | 7/1998 | Pathak .................. | G11C 11/419 365/156 |
| 5,848,023 A | * | 12/1998 | Kato ........................ | G11C 8/12 365/230.09 |
| 5,936,909 A | * | 8/1999 | Sonoda ................ | G11C 7/1018 365/190 |
| 6,115,280 A | * | 9/2000 | Wada ................... | G11C 7/1006 365/189.02 |
| 8,174,868 B2 | | 5/2012 | Liaw | |

\* cited by examiner

*Primary Examiner* — Son Mai
(74) *Attorney, Agent, or Firm* — Michael A. Davis, Jr.; Frank D. Cimino

(57) ABSTRACT

In aspects of the present application, circuitry for storing data is provided including a static random access memory (SRAM) circuit operable to store data in an array of SRAM cell circuits arranged in rows and columns, each SRAM cell coupled to a pair of complementary bit lines disposed along the columns of SRAM cells circuits, and one or more precharge circuits in the SRAM memory circuit coupled to one or more pairs of the complementary bit lines and operable to charge the pairs of complementary bit lines to a precharge voltage, responsive to a precharge control signal. The precharge control signal within the SRAM circuit is operable to cause coupling transistors within the SRAM circuit to couple a pair of complementary bit lines to the precharge voltage responsive to mode signals output from a memory controller circuit external to the SRAM circuit, indicating a bitline precharge is to be performed.

18 Claims, 7 Drawing Sheets

| PIN NAME | DESCRIPTION | FUNCTION |
|---|---|---|
| BM | BURST MODE ENABLE | WHEN HIGH, MEMORY OPERATES IN BURST MODE. HERE BITLINE PRECHARGE AND WORDLINE FIRING DEPENDS ON EXTERNAL INPUTS PCHF AND PCHL. THIS MODE RESULTS IN REDUCTION IN ACTIVE POWER. BM=0 DISABLES BURST MODE AND MEMORY WORKS IN THE CONVENTIONAL MODE |
| PCHF | CONTROLS BITLINE PRECHARGE | WHEN HIGH, ENABLES BITLINE PRECHARGE IN FIRST HALF OF CYCLE. IS ACTIVE ONLY IN BURST MODE OF OPERATION (BM=1). AS PRECHARGE IS OCCURRING AT THE START OF CYCLE, NORMAL OPERATION WILL GET DELAYED AND WILL LEAD TO PENALTY IN TCYCLE, ACCESS TIME |
| PCHL | CONTROLS BITLINE PRECHARGE | WHEN HIGH, ENABLES BITLINE PRECHARGE IN SECOND HALF OF CYCLE. IS ACTIVE ONLY IN BURST MODE OF OPERATION (BM=1) |

| PIN NAME | DESCRIPTION | FUNCTION |
|---|---|---|
| BM | BURST MODE ENABLE | WHEN HIGH, MEMORY OPERATES IN BURST MODE. HERE BITLINE PRECHARGE AND WORDLINE FIRING DEPENDS ON EXTERNAL INPUTS PCHF AND PCHL. THIS MODE RESULTS IN REDUCTION IN ACTIVE POWER. BM=0 DISABLES BURST MODE AND MEMORY WORKS IN THE CONVENTIONAL MODE |
| PCHF | CONTROLS BITLINE PRECHARGE | WHEN HIGH, ENABLES BITLINE PRECHARGE IN FIRST HALF OF CYCLE. IS ACTIVE ONLY IN BURST MODE OF OPERATION (BM=1). AS PRECHARGE IS OCCURRING AT THE START OF CYCLE, NORMAL OPERATION WILL GET DELAYED AND WILL LEAD TO PENALTY IN TCYCLE, ACCESS TIME |
| PCHL | CONTROLS BITLINE PRECHARGE | WHEN HIGH, ENABLES BITLINE PRECHARGE IN SECOND HALF OF CYCLE. IS ACTIVE ONLY IN BURST MODE OF OPERATION (BM=1) |

FIG. 11

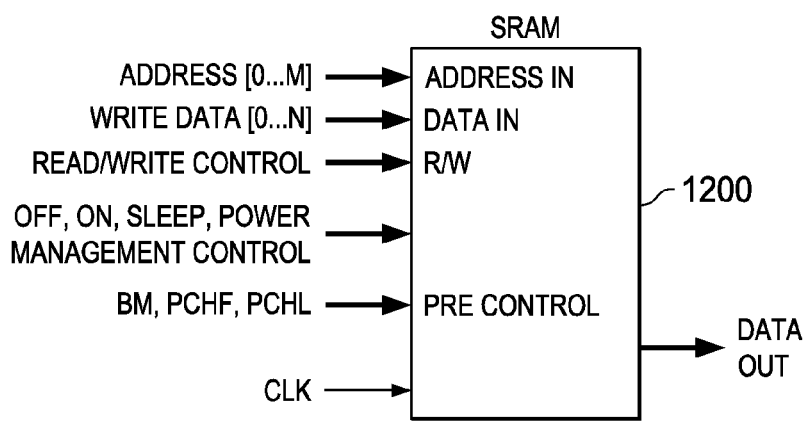

FIG. 12

CIRCUITS AND METHODS FOR PERFORMANCE OPTIMIZATION OF SRAM MEMORY

TECHNICAL FIELD

Aspects of the present application relate generally to the use of static random access memory (SRAM) devices and in particular to optimizing the performance of SRAM devices.

BACKGROUND

Aspects of this application relate in general to electronic circuitry and in particular to methods and circuitry for optimizing the performance of SRAM memory devices. Recently SRAM memory devices are increasingly used for "on-board" data storage for highly integrated circuits, which may form a single chip solution for a particular system. These integrated circuits typically have several functional blocks which together form a complete system, and are sometimes called a "System on a Chip" or "SOC." Use of SOCs reduces the number of components, the board area, and the interconnections between packaged integrated circuits on a circuit board, thereby increasing performance and reliability and reducing the size of the components. SRAM memory is particularly useful for an SOC as it has the advantages of relatively fast data access and static data storage in a memory, and SRAM maintains the stored data so long as power is present. Dynamic RAM (DRAM) is sometimes used as data storage as it is far denser than SRAM but DRAM has to be refreshed periodically or data errors occur due to inherent leakage currents, and DRAM can have longer data access time. DRAM is also typically manufactured in specialized semiconductor processes, making integration of DRAM on board SOC devices more difficult. In contrast, SRAM cells are easily manufactured within an integrated circuit alongside the other logic circuitry used to form microprocessor or microcontroller blocks, data registers, dedicated functional blocks such as ALUs, shifters, and the like, that are used as functional blocks on an SOC.

FIG. 1 is a block diagram of circuitry for use with SRAM devices. FIG. 1 depicts, as an illustrative example of the use of on-board SRAM memory, an SOC for an application such as an "internet of things" or "IoT" application. The SOC has several functional blocks which, in prior generation devices, might have been provided as separate integrated circuits but which in recent years are increasingly formed together on an SOC. Recently, memory devices and particularly SRAM memories are increasingly included "on board" the SOC.

In FIG. 1, the non-limiting example SOC includes sensors 101, radio transceivers 103, analog front end or "AFE" 105, power management or "PM" 107, a microcontroller or "µC" 109, non-volatile memory or "NVM" 111, and static RAM 113. SRAM ("RAM" 113) can be used in any number of applications, and this example SOC 100 is presented for illustration purposes only. Also, SOC 100 can include more, fewer, or different functional blocks. The sensors 101 can be any one of a variety of sensor types such as sensors sensing pressure, temperature, sound, light, user input from a control panel, etc. Radios 103 can implement a variety of interfaces between the SOC 100 and external devices using a variety of over the air interfaces. Examples of over the air interfaces include, for non-limiting examples, Bluetooth, WiFi, WiMAX, cellular communications such as 3G, 4G, LTE, radio frequency standards such as used for RFID tags, and the like. Analog front end "AFE" 105 can implement a variety of analog to digital conversion functions such as sigma delta analog to digital converters (ADCs), recursive and pipelined ADCs, and the like used for receiving analog signals from the sensors, for example, and for outputting digital data for use by other blocks in the SOC. Power management "PM" 107 can implement a variety of power management functions, such as clock speed control, battery management, sleep, wait states, etc. to extend the life of a battery for a portable device application, for example. Microcontroller 109 can be implemented using a wide variety of existing processors provided as cores or macros such as mixed signal processors (MSPs), digital signal processors (DSPs), reduced instruction set machines such as RISC cores, advanced RISC machines such as ARM cores, general purpose microprocessors, and microcontrollers. Simple state machines can also be used as microcontroller 109. Various aspects of the present invention are compatible with a wide variety of applications. In some applications, portable devices including SOCs typically have sleep, stand by, and other power saving modes typically used in order to preserve battery life. These power saving modes often involve reducing a clock frequency, since lower clock frequencies save power in most integrated circuit devices.

The memory portions of the example SOC 100 include a non-volatile memory portion NVM 111. NVM 111 can be implemented using EEPROM, E2PROM, FLASH, ROM and even fixed data storage such as hardwired ROM or programmable fuse or anti-fuse data storage. The NVM 111 can be used to store fixed data words such as program instructions for the microcontroller 109, code words, security keys, and the like. Programmable non-volatile memory such as EEPROM or FLASH can be used in a prototyping environment to develop program instructions for a particular application of SOC 100. Later versions of the SOC 100 can be produced with fixed data in non-volatile memory, such as a ROM.

RAM 113 can be implemented with an SRAM memory. SRAM memory is increasingly used to store data on board an SOC. The SRAM memory can store register values, computational results, program words and data which need to be retrieved by other blocks in the system. SRAM 113 is typically arranged on a memory bus with an address input, and read/write control line that are latched into the SRAM by a clock input signal. The read operations for the SRAM 113 result in data words that are output from the SRAM 113 which are valid at the end of a memory cycle. Typically the data valid time will occur sometime before the next rising edge of the clock input signal, so that the system can clock the valid SRAM data as input to other functional blocks. The minimum access time needed for the SRAM to receive the address and read request inputs, decode the address to select an addressed SRAM cell with rows and columns, sense the differential voltage and amplify the data, and output the data, referred to as the memory cycle, can be the limiting factor on the maximum system clock speed for the SOC. Improvements in the SRAM memory cycle time are therefore needed to enable the increase of the operational speed of devices using SRAMs.

FIG. 2 is a block diagram of a prior known solution SRAM device 200. FIG. 2 is presented for use in describing the operations of the prior known solutions. SRAM 200 receives as input signals an address field labeled "Address," a data input field labeled "Write Data" used for write operations to the SRAM 200, a read write control input labeled "Read/Write" indicating that a particular access operation is a read or write operation, and a clock signal labeled "CLK." There are various additional control signals input to the SRAM 200 for tailoring the operation of the SRAM 200 for different operating conditions, including input control signals labeled "OFF, ON, Sleep," and other inputs used to reduce or increase the power used in different operating conditions. Power reduction is increasingly important for battery operated portable devices such as tablet computers, smart phones, web browsing devices, digital cameras, camcorders and the like.

FIG. 3 illustrates a timing diagram for an SRAM device such as SRAM 200. FIG. 3 illustrates the memory cycle time in a timing diagram when operating in a READ operation. Following a rising clock edge on the input clock signal CLK, a memory access is performed. During the first portion of the memory access, the data at the outputs of the SRAM 200 is not valid. This is shown by the shading on the output signal Q in FIG. 3. The internal operations of the memory device that occur prior to valid data being available at the output of the SRAM device include: decoding a first portion of the address field to determine which row of memory cells is being addressed in row decoders, firing the selected word line signal to cause the row of memory cells to share data with columns of complementary bit lines coupled to the SRAM cells, selecting one or more columns (depending on the width of the memory word, which may be a X1, X4, X8, or X16 word width) using a second portion of the address field in column decoders, and enabling the selected columns to be sensed by a plurality of sense amplifiers using a column select or Y-select multiplexer. The sense amplifiers then latch the differential voltage signal that is on the complementary bit lines and the sense amplifiers amplify the signal to a logic level voltage that is then valid data presented at the data output signals Q of the SRAM 200. The timing diagram in FIG. 3 shows the data arriving at the output as "Q0 Data Valid." In the timing diagram, two sequential data accesses are illustrated. The time that is needed from the rising edge of the CLK signal to the valid data Q0 Data Valid, and Q1 Data Valid, at the outputs is the memory access time, and is sometimes referred to as the performance metric "Clk-to-Q" time.

Each conventional SRAM memory access involves several operations that happen internally within the SRAM device 200 in a particular sequence. To further describe the SRAM operations, FIG. 4 depicts in a simple circuit diagram a single memory cell 400 and a precharge circuit 401.

FIG. 4 is a circuit diagram of an SRAM cell. In FIG. 4 a six transistor SRAM cell 400 is depicted. Two cross coupled CMOS inverter devices are formed by the P-type transistor P1 and N-type transistor M1, forming a first inverter, and P-type transistor P2 and N-type transistor M2 forming a second inverter. The cross coupled inverters form a storage latch that stores a datum on nodes SNT and SNC as complementary voltages. Depending on the architecture of the system, the stored voltages can correspond either to a logic one or to a logic zero. Two access transistors labeled IN1 and IN2 selectively couple the storage nodes SNT and SNC to two complementary bit lines BLT and BLC when there is a high voltage on the word line WL. Because the four transistors P1, M1, P2, M2 making up the two inverters and the access transistors IN1 and IN2 form a complete SRAM cell, this SRAM cell is known as a "6T" SRAM cell. Aspects of the present application can also be applied to SRAM architectures using other arrangements, such as an 8T SRAM cell. 8T SRAM cells include the transistors of FIG. 4 and additionally 8T SRAM cells have separate read and write access ports. In aspects of the present application, an SRAM device can be formed using 8T SRAM cells as well as with the 6T SRAM cells shown here.

FIG. 4 further depicts a word line WL shown running horizontally across the SRAM cell 400. (Note that the orientation of the word lines or row lines as 'horizontal' refers only to the example circuit diagram, and the bit lines are often described as arranged in a "vertical" direction, however in an actual physical implementation of the SRAM cells and of SRAM arrays, these signals can be oriented in various ways and the word line and bit lines can be oriented in any number of directions.) A plurality of the SRAM cells will be arranged along a plurality of word lines WL in a typical SRAM array. Current SRAM arrays can include thousands, tens of thousands and even more SRAM cells. The example SRAM cell 400 is further coupled to a pair of complementary bit lines labeled BLT, and BLC, arranged in another direction. In an example SRAM circuit the columns of bit lines can be oriented in a "vertical" direction. In a typical SRAM array, a plurality of SRAM cells can be arranged along columns, each column having a pair of complementary bit lines. An address directed to the SRAM array specifies a row of cells and a column (or a group of columns) of cells to be written to, or read from, for each access to the SRAM device. The SRAM device architecture can be an X1, X4, X8 or X16 architecture, as examples, depending on the number of columns of SRAM cells that are accessed in each cycle.

In operation, a read cycle to access the data (referred to as a "datum") stored in the SRAM cell 400 begins by raising the voltage on the word line or "firing" the word line labeled WL. When the word line WL has a high voltage on it greater than a threshold voltage, the access transistors IN1, and IN2, which can be referred to as pass transistors, turn on and couple the bit lines BLT and BLC to the storage nodes SNT and SNC in the SRAM cell 400. Once the access transistors IN1 and IN2 are active, the voltages on the bit lines BLT and BLC will move apart as the differential voltage stored in the SRAM cell 400 is shared with the bit lines. One of the bit lines BLT, BLC will increase by a differential voltage, and the other will decrease, depending on the value of the datum stored as a voltage on the complementary storage nodes SNT and SNC. When the voltage levels on the bit lines spread apart due to being coupled to the storage nodes by a charge sharing operation, the slight difference voltage can be sensed by a column sense amplifier (not shown) coupled to the bit lines BLT and BLC, which will amplify the difference voltage to a full logic level.

The SRAM cell 400 outputs only a small differential voltage onto the bit lines BLT and BLC. Sense amplifiers (not shown) are coupled to the bit lines during a memory access and sense the small differential voltage. Because the differential voltages stored in the SRAM cells are very small signal level voltages, the bit lines are first precharged to a common precharge voltage. In FIG. 4, precharge transistors IP1 and IP2 are shown in precharge circuit 401 and are coupled to the bit lines B/LT and B/LC. Each column of SRAM cells can share a precharge circuit over all of, or a portion of, the SRAM array. When a control signal PRE_BL is active, these precharge transistors couple a voltage supply labeled Vprecharge to both of the bit lines BLC and BLT. Each one of the bit line pairs in an SRAM array requires a precharge circuit such as circuit 401, however many SRAM cells can be coupled to the columns formed by the bit line pairs and share the same precharge circuit.

In operation, the precharge control signal PRE_BL in a conventional SRAM array is active at least once in each memory access cycle, typically, at the end of the current memory access cycle and typically before the next memory cycle begins. The precharge voltage Vprecharge can be a voltage between a minimum and maximum supply voltage level, such as Vdd, or Vdd/2. When the control signal PRE_BL is active, the bit lines BLT and BLC are both precharged to this voltage Vprecharge.

FIG. 5 is a block diagram of an SRAM device presented in order to further explain the operation of the SRAM memory devices. In FIG. 5, an array of SRAM cells 501a-501c are shown disposed in a first column, 503a-503c are disposed in a second column, and are arranged in rows a-c with word lines labeled WLa-WLc in an SRAM device 500. Note that in an actual production SRAM device there can be thousands or tens of thousands of SRAM cells, or more. The word lines WLa-WLc are output by the row decoder ROW DEC. numbered 505. A column decoder labeled COL. DEC. numbered 507 outputs control lines to a multiplexer Y-SEL numbered 509 that receives as inputs bit line pairs BLT0, BLC0 to BLTn, BLCn, and that outputs a pair of complementary Y select complementary outputs labeled YT, YC to a sense amplifier labeled Sense and numbered 513. The sense amplifier 513 latches the differential voltage on the selected bit line pair and outputs the signal DATA.

Each of the true and complement bit line pairs BLT0, BLC0 to BLTn, BLCn, are coupled to a corresponding precharge circuit numbered 5110-511n. A precharge control circuit labeled PRE; and numbered 515, outputs the precharge control signal PRE_BL to the precharge circuits.

In operation, the SRAM 500 memory access cycle begins when a clock signal CLK goes high. The address input signal ADD is latched and row decoder ROW DEC. 505 begins decoding a portion of the address field and outputs a high voltage on a selected one of the word lines WLa-WLc, selected by a portion of the address. The column decoder COL. DEC. 507 begins by decoding a second portion of the address field ADD and outputs a select signal to the Y-sel. multiplexer 509. The Y-sel. multiplexer determines which ones of the bit line pairs BLT0, BLC0-BLTn, BLCn is selected.

When the word line voltage on the selected word line WLa-WLc rises, the complementary bit lines for the SRAM cells along the selected row are coupled to the storage nodes within each of the SRAM cells. The voltages on the complementary bit line pairs in each column begin to spread apart as the differential voltage in the SRAM cells is shared with the bit lines. Each bit line along the active row will take the differential voltage value of the storage nodes of the SRAM cells in the corresponding columns.

The column select multiplexer 509 labeled Y-SEL then couples the selected bit line pair to the complementary output signals YT and YC. COL. DEC. 507 determines which column is selected based on a column portion of the input address ADD. Sense amplifier 513 then receives the differential voltage signal, senses the differential voltage, latches and amplifies it, and outputs the data from the selected SRAM cell on the output data signal DATA.

As described above the memory access cycle includes several steps performed internal to the conventional SRAM memory 500 during each clock cycle. FIG. 6 is a timing diagram of a memory cycle of an SRAM device such as SRAM memory 500. As shown in FIG. 6, the memory access cycle begins with the "Fire WL" operation by firing a word line determined by the row decoder circuit. When the word line fires, the complementary bit lines receive the differential voltage of the SRAM cells along the selected row. During the "Sense Data" operation, the sense amplifiers receive the data that is represented by the differential voltage on the bit line pairs selected by the Y-sel multiplexer. In the example shown in FIG. 6, a precharge operation "Precharge" is performed after the sense amplifier latches the valid data. The precharge in this example is performed at the end of the memory access cycle. The maximum clock frequency for the input clocking signal CLK that can be used for a particular SRAM memory is determined by the amount of time needed to perform the sequential steps of: decoding the address in the row and column decoders, firing the word line for the selected row, sharing the stored data onto the bit line pairs as a differential voltage, sensing the differential voltage in a sense amplifier, and precharging the bit lines for the next memory access. In order to increase performance of a circuit including an SRAM memory such as the example SRAM 500 shown in FIG. 5, the memory cycle time "Tcyc" should be decreased so that the clock frequency can be increased.

Improvements in the operations of SRAM memory devices, and in particular SRAM memory devices arranged for integration into SOCs or into other highly integrated devices, are therefore needed in order to address the deficiencies and the disadvantages of the prior known approaches. Solutions are needed that reduce the memory access cycle time and that reduce the power consumed for the SRAM operations, and which improve the SRAM performance, for example in terms of performance metrics such as the Clk-to-Q access time and SRAM power consumption.

SUMMARY

Various aspects of the present application provide circuits and methods for optimizing the performance of an SRAM device. In various aspects of the present application, the precharge circuitry for the SRAM device can be controlled and used in a manner that optimizes performance. This is accomplished, for example, by adding additional control signals for the precharge circuitry to an external interface to the SRAM device.

In aspects of the present application, circuitry for storing data is provided including a static random access memory (SRAM) circuit operable to store data in an array of SRAM cell circuits arranged in rows and columns, each SRAM cell coupled to a pair of complementary bit lines disposed along the columns of SRAM cells circuits, and one or more precharge circuits in the SRAM memory circuit coupled to one or more pairs of the complementary bit lines and operable to charge the pairs of complementary bit lines to a precharge voltage, responsive to a precharge control signal. The precharge control signal within the SRAM circuit is operable to cause coupling transistors within the SRAM circuit to couple a pair of complementary bit lines to the precharge voltage, responsive to mode signals output from a memory controller circuit external to the SRAM memory circuit indicating a bitline precharge is to be performed.

Recognition is made in the aspects of this application of solutions for providing an SRAM device with improved performance. The novel circuits and methods discovered and disclosed herein enable the use of fewer precharge cycles for selected memory access cycles, and advantageously provide shorter memory access cycle times with lower power consumption than for the memory access cycles obtained for the prior known solutions.

BRIEF DESCRIPTION OF THE DRAWINGS

FIG. 11 is a table illustrating signals used in an example arrangement for providing aspects of the application;

FIG. 12 is a block diagram of an SRAM device incorporating arrangements for providing aspects of the application;

Corresponding numerals and symbols in the different figures generally refer to corresponding parts unless otherwise indicated. The figures are drawn to clearly illustrate the relevant aspects of the illustrative example arrangements and are not necessarily drawn to scale.

DETAILED DESCRIPTION

Figure 1:
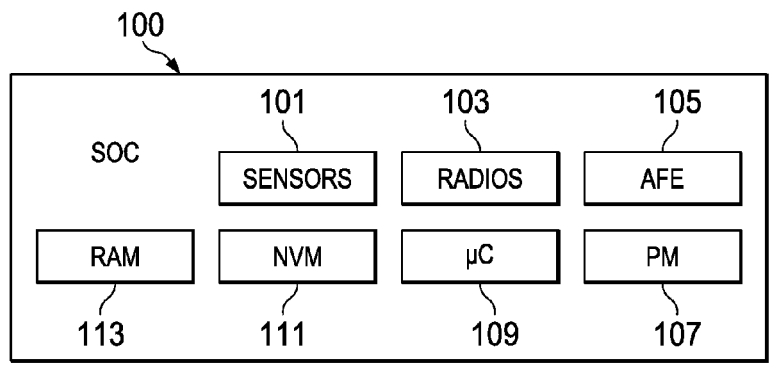
FIG. 1 is a block diagram of circuitry for use with SRAM devices.
Figure 2:
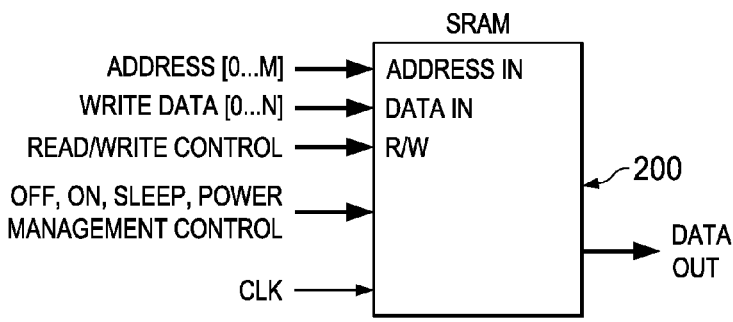
FIG. 2 is a block diagram of an SRAM device.
Figure 4:
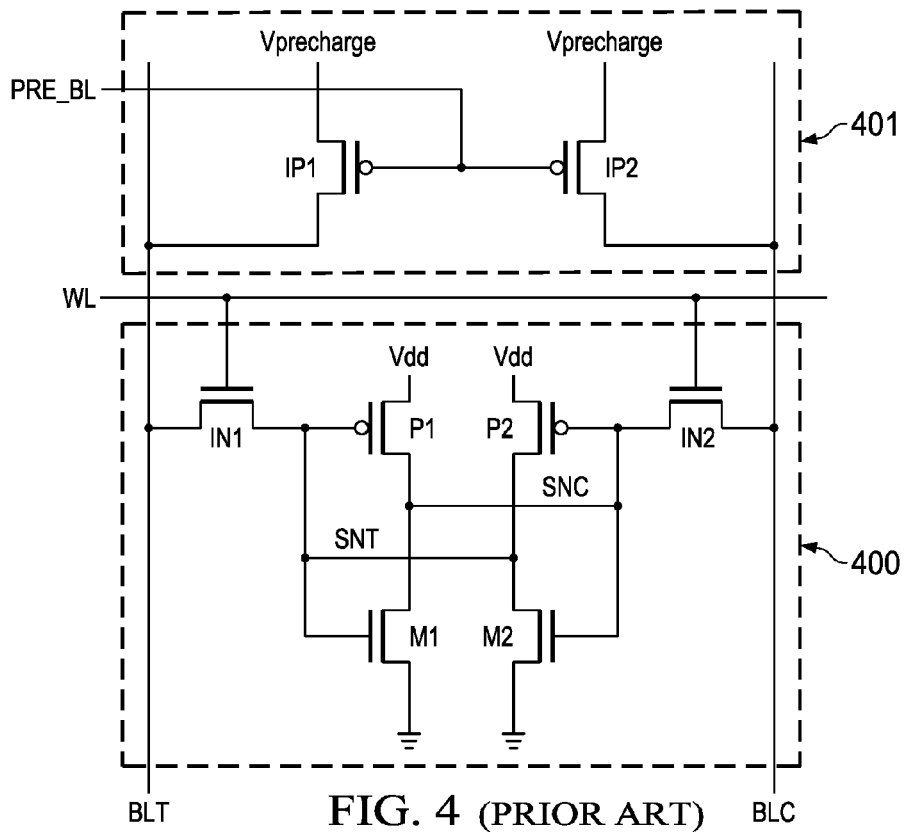
FIG. 4 is a circuit diagram of an SRAM cell.
Figure 3:
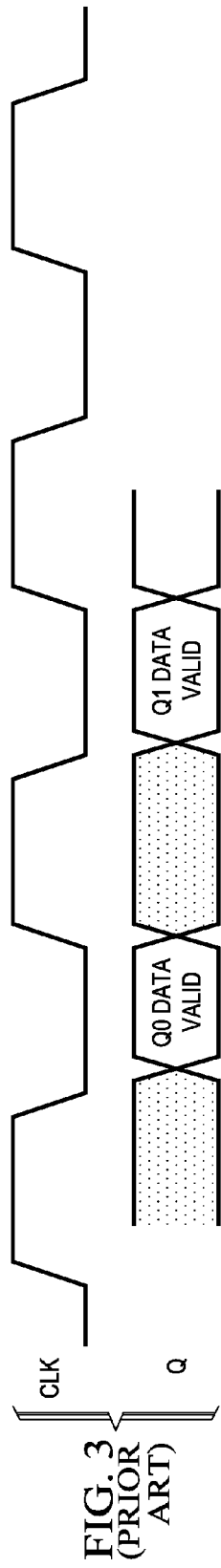
FIG. 3 is a timing diagram for an SRAM device.

In aspects of the present application, it has been advantageously discovered by the inventors that, for many SRAM arrays, the bit line pairs can act as additional data storage nodes. Recognition of this characteristic aspect of SRAM memory arrays enables various novel methods and arrangements to be performed, optimizing the performance of SRAM memory devices. In one example method discovered by the inventors, SRAM memory accesses use only a single word line firing and a single precharge operation for a series of SRAM memory accesses to a plurality of SRAM cells. In novel approaches that are aspects of the present application, the methodology discovered by the inventors recognizes that as the word line is fired for a particular row, the data in each SRAM cell along that particular row is transferred to all of the bit line pairs in the corresponding columns coupled to the SRAM cells along that row. The inventors of the present application have discovered that it is not necessary to perform another word line firing, or to perform another precharge operation, for each sequential memory access. Instead, the bit lines can be precharged once, the word line can be fired, and the sensed data can be output for each of the SRAM cells until a new complete memory access cycle is needed. The precharge operation is performed again when an access is required to an SRAM cell that is located on a different row in the SRAM array. In the novel methods, the average memory access cycle time can then be substantially shortened over the prior known solutions, because the sequential memory access cycles do not require a row decode, word line firing, and precharge operation to be performed for each memory cell access.

In the prior known solutions, the SRAM memory accesses were partitioned into system information, and SRAM internal operations. In the prior approaches, the system presents an address and a read/write control signal for each memory access. For write operations, write data is also provided. The SRAM accesses in the prior known solutions begin on a clock edge, typically a rising clock edge, for the input clock signal. For each memory access, conventional SRAM memory includes internal control circuitry that performs the various internal operations in a manner that is opaque to the system. At a certain time following the rising clock edge, the data at the SRAM outputs (for a read access) is valid and available to the system prior to the next rising clock edge, so the system can latch the read data and use it in various system operations.

However, in the prior known solutions, the system has no control over the internal operations of the SRAM memory. Further, the information available to the system is not available to the SRAM memory. For example, in a typical arrangement, the system can know that the next several SRAM operations are to sequential SRAM cell locations in the SRAM memory. However, the control circuitry within the SRAM memory does not receive that information. In the prior known approaches, each SRAM read operation was performed in the same manner and without any knowledge of the future operations. Each SRAM data read and data write operation was performed with a decoding operation, a word line firing, a data sense (or data write) operation, and a bit line precharge operation. The time needed for these operations is the same for each SRAM memory operation. The memory cycle time in the prior known approaches depends on the total time needed for these operations.

In an aspect of the present application, the methodology discovered and developed by the inventors includes consideration of the internal operations of the SRAM memory device as well as consideration of the system information about future SRAM accesses. In sharp contrast to the prior known approaches, in the novel methodology developed by the inventors of the present application, the internal SRAM operations can be controlled by, or modified by, the system. Further, the system can tailor the internal SRAM operations based on the knowledge about future SRAM accesses, the system clock frequency, and the SRAM architecture and address space. By providing control and/or visibility of the internal SRAM operations to the system, the memory access cycle time can be greatly shortened for certain operations, the overall system performance is advantageously increased by use of the novel arrangements, and the power consumed by the SRAM memory during operations is also reduced.

Figure 6:
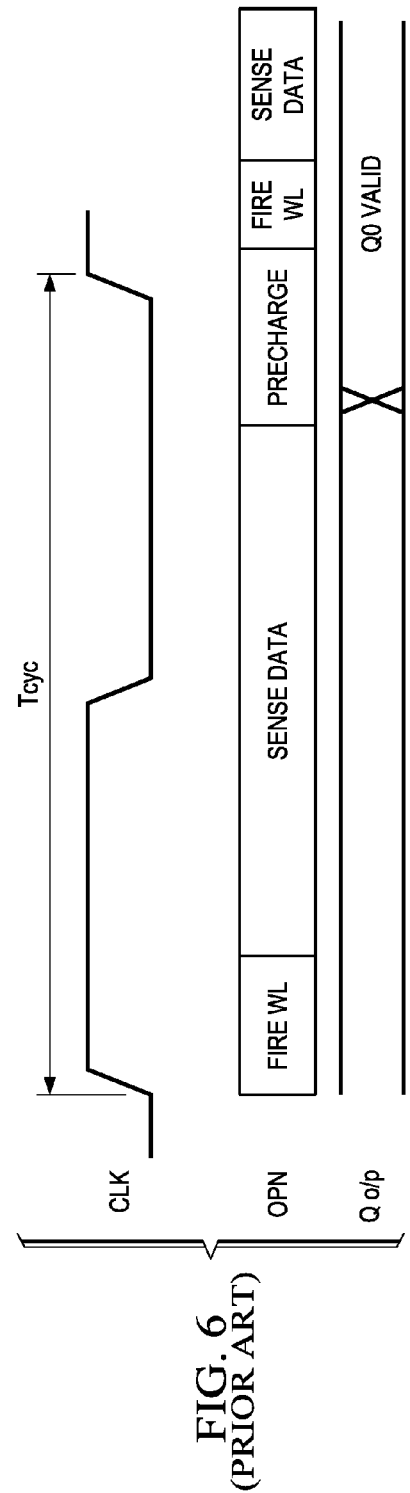
FIG. 6 is a timing diagram of a memory cycle of an SRAM device.
Figure 5:
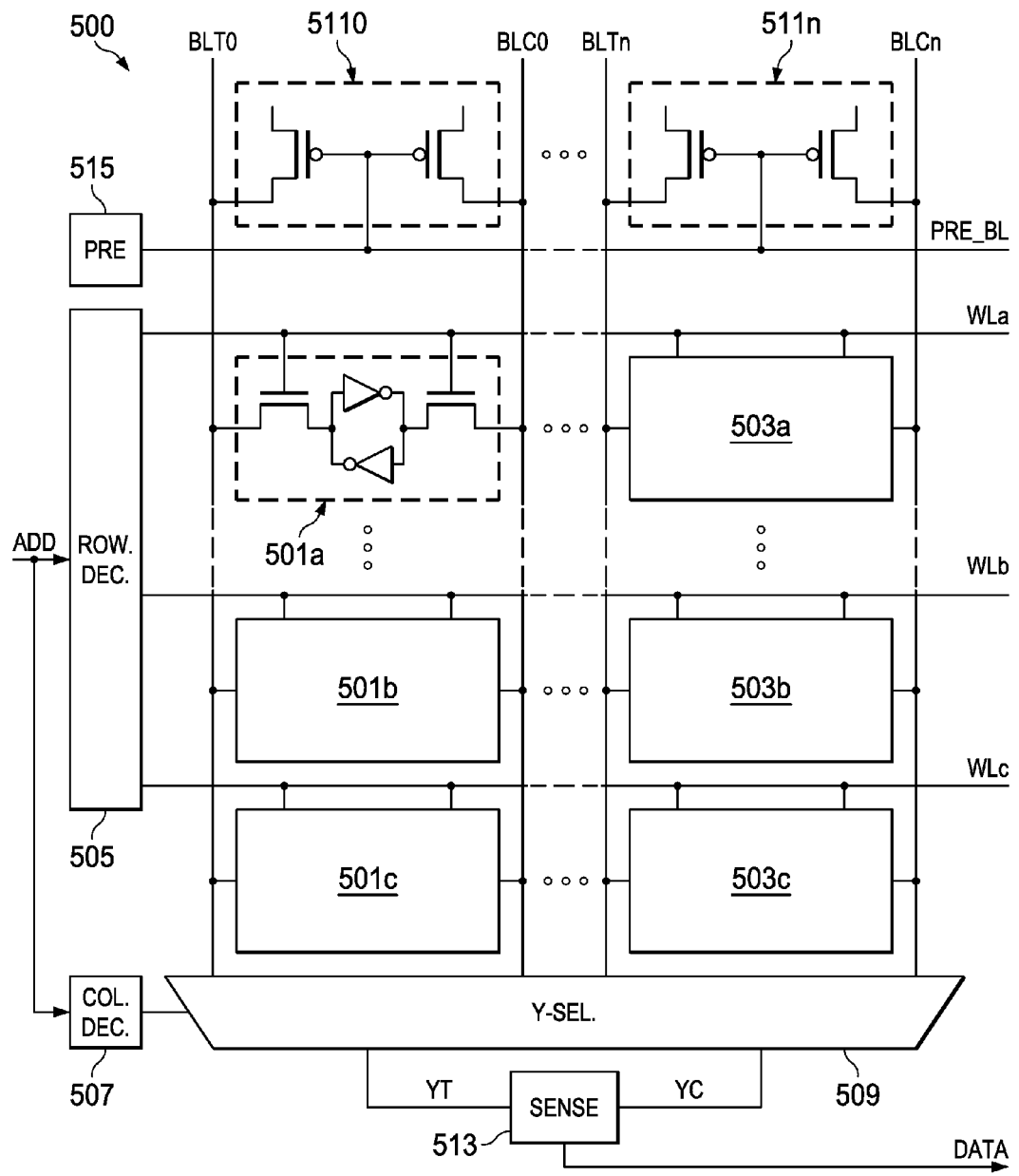
FIG. 5 is a block diagram of an SRAM device.
Figure 7:
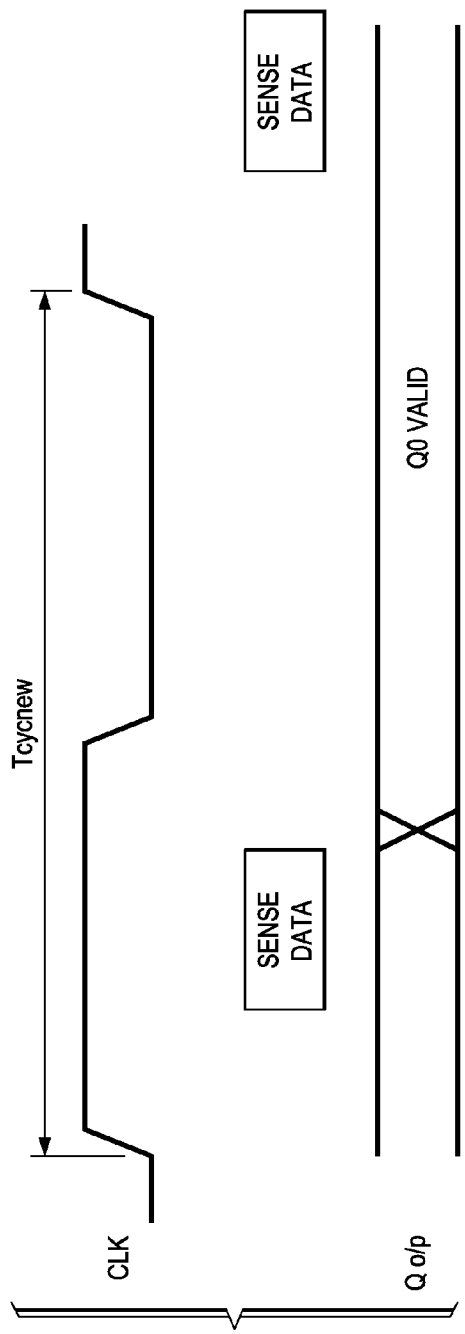
FIG. 7 is a timing diagram of an SRAM device incorporating an aspect of the application.

FIG. 7 is a timing diagram of an SRAM device incorporating an aspect of the application. In FIG. 7, two sequential SRAM read accesses are illustrated. In the novel methods, as sequential memory cell accesses are performed, the word line firing, and the precharge operation are no longer necessarily performed in every memory access cycle. In the particular example of a novel SRAM operation shown in FIG. 7, sensing and data output operations for sequential SRAM cell accesses are performed without the word line firing and precharge operations required in the prior known solutions as shown in FIG. 6 above. Use of the novel methodologies of the present application advantageously enables a shorter memory access time (labeled Tcycnew).

Figure 8:
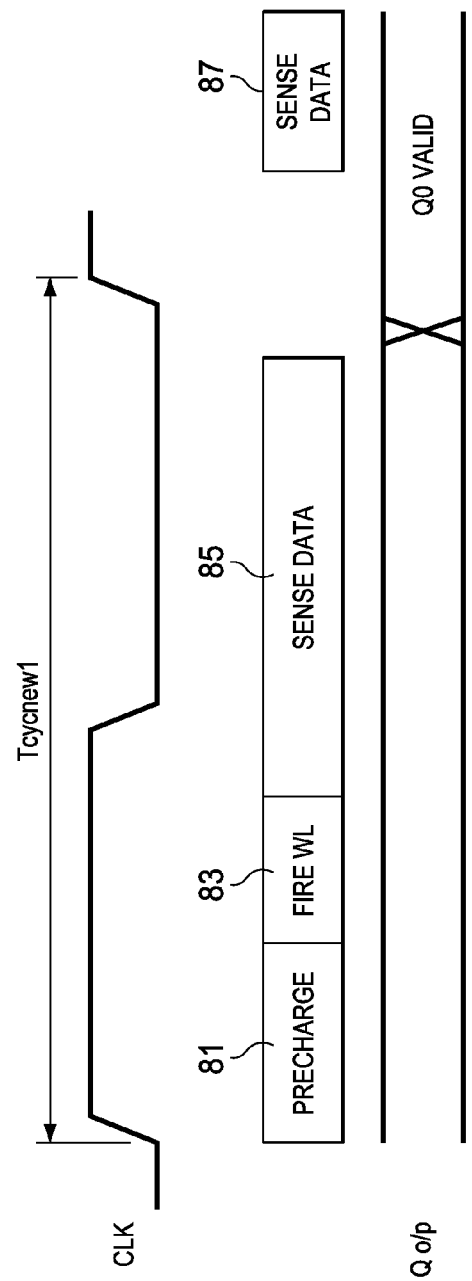
FIG. 8 is a timing diagram of an SRAM device incorporating another aspect of the application.

FIG. 8 is a timing diagram of an SRAM device incorporating another aspect of the present application. In FIG. 8, a timing diagram for a sequence of accesses to a series of SRAM cells arranged along a particular row in the SRAM array is depicted. FIG. 8 depicts a "precharge first" mode of operation as an example aspect of the present application. In FIG. 8, prior to the first SRAM cell access to a newly addressed row (or, for a first SRAM access after a power up, reset, or wake up operation), a precharge operation (numbered 81 in FIG. 8) first precharges all the complementary bit line pairs in the SRAM array. The selected row line is determined for the first SRAM cell in the sequential access, and the row decoder fires the selected word line (operation labeled Fire WL, 83). When the word line voltage is raised above a transistor threshold voltage for the SRAM cells, the SRAM cells disposed along a particular row in the SRAM array, the complementary bit line pairs coupled to the SRAM cells each receive a differential voltage corresponding to the stored data within each of the SRAM cells along the selected row line. The column decoder simultaneously decodes the column portion of the address field and controls the Y-select multiplexer to select the column for the read operation. A sensing operation numbered 85 is then performed, and as shown in FIG. 8, the first read data Q0 VALID becomes available as the sense amplifiers output the latched sense data.

As is also shown in FIG. 8, following the first SRAM memory cell access, the second SRAM cell is accessed by selecting the next addressed column (which is on the same row in the SRAM array, but the second SRAM cell need not be adjacent to the column of the prior accessed SRAM cell), in the sequential access. The corresponding bit line pair for this column is then coupled to a sense amplifier, and the differential voltage is sensed (Sense Data, operation 87) and the data from this SRAM cell is output. In an advantageous aspect of the arrangements discovered by the inventors, the cycle time needed for the second and any subsequent memory accesses to the SRAM cells in the selected row is shorter than the memory access time Tcycnew1 for the first memory access, because the precharge operation and the word line firing is not performed for the subsequent accesses. This is possible because as advantageously discovered by the inventors, the bit line pairs in the SRAM array already have the differential data for each SRAM cell along the selected row stored on them. Thus, by recognizing that the bit line pairs can act as storage nodes and that the bit line pairs contain the SRAM data for each cell along the selected row after the first access to a memory cell on a particular row, the memory access times can be greatly reduced by simply selecting the bit line pairs for sequential SRAM cells along the same row, and using the sense amplifiers, sensing the data, for each access. In sharp contrast to the memory access cycle illustrated for the prior known solutions in FIG. 6, in the novel methods discovered by the inventors of the present application, the precharge operations and the word line firing can be performed only once for the access to the SRAM cells arranged along a particular row.

Figure 9:
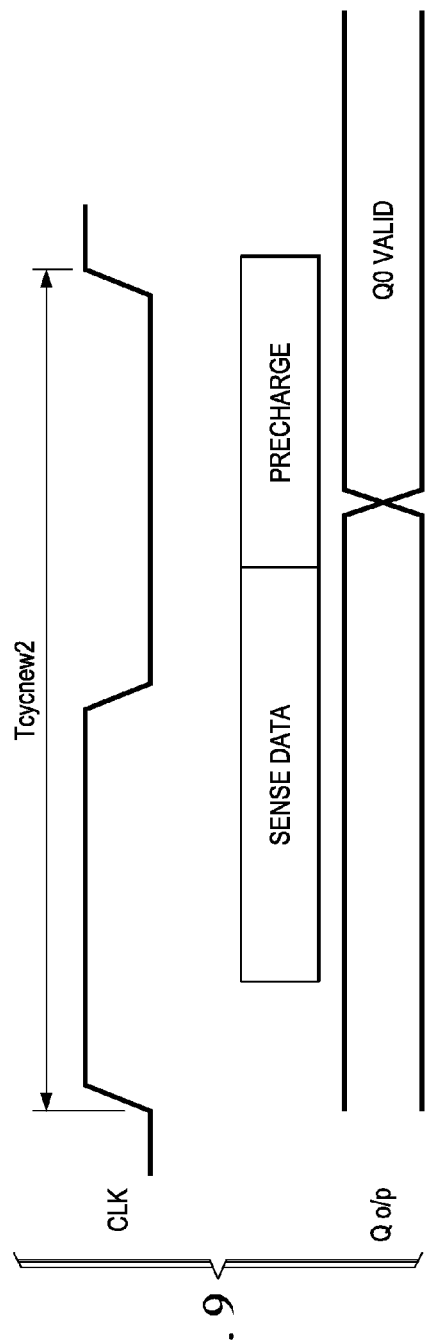
FIG. 9 is a timing diagram of an SRAM device incorporating a different aspect of the application.

FIG. 9 is a timing diagram of an SRAM device incorporating a different aspect of the application. FIG. 9 illustrates in a timing diagram a "precharge last" mode of operation of an arrangement that forms another aspect of the present application. In FIG. 9, when the system determines that the present SRAM access is the last access to the SRAM along a particular row of SRAM cells, based on the address of the next access that is to be issued for the SRAM, for example, a "precharge last" operation is performed. As shown in FIG. 9, a sensing operation on a row of cells is performed (operation 91). In this aspect of the present application, the system knows that this access is the last access to the SRAM cells along this particular row. For example, the system may be aware that the next access to the SRAM is to another row of SRAM cells. Alternatively, the system may know that the next access is not for many cycles, because a program being executed by the system does not require SRAM access. The system can be entering a power save, sleep, or wait mode of operation, and no SRAM accesses are to be performed during these modes. The system can direct the SRAM to perform a "precharge last" to ready the bit line pairs for an access to another row in the SRAM, for example. In FIG. 9, the precharge operation (operation 93) now follows the sense data operation 91. During the precharge last operation, the bit line pairs in the columns of SRAM cells are each coupled to a precharge voltage as is described above by a precharge circuit. Depending on the architecture of the system, the precharge operation can cause a slightly longer cycle time (labeled Tcycnew2) in the memory device, however, if the next system clock cycle does not have a data access, the precharge last operation is transparent to the overall system operation. The data latency time is therefore not affected by the "precharge last" operation.

Figure 10:
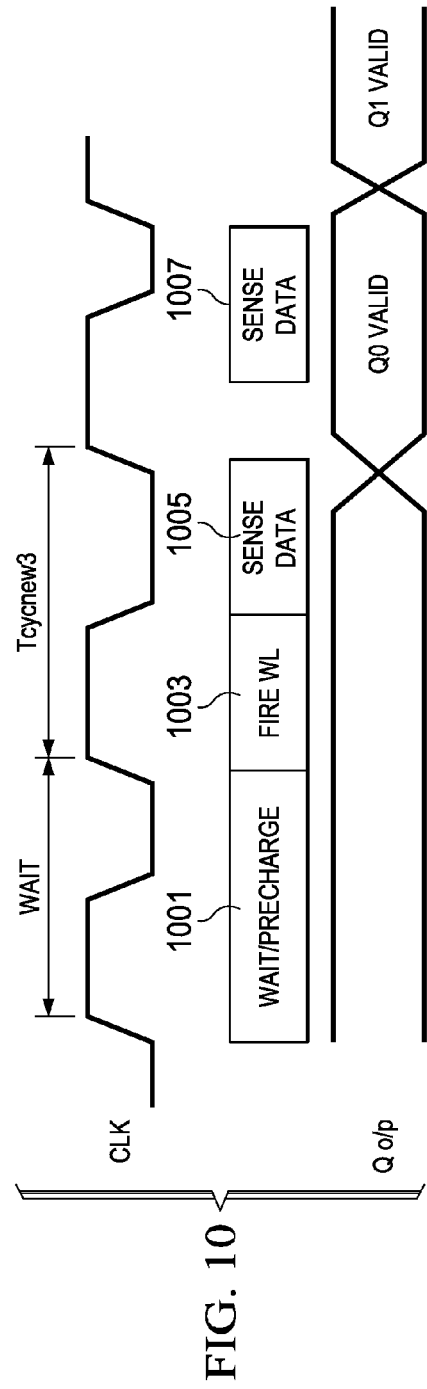
FIG. 10 is a timing diagram of an SRAM device incorporating another aspect of the application.

FIG. 10 illustrates in a timing diagram another arrangement that forms an additional aspect of the present application. In FIG. 10, a high performance mode is illustrated for operating the SRAM device. The clock frequency CLK in FIG. 10 is at an approximately constant duty cycle. This arrangement of the present application is particularly useful for a high frequency operation in a pipelined architecture where it is important that each clock cycle be of the same overall duration. In accessing a row in the SRAM, the bit lines are first precharged using a "Wait/Precharge" cycle as shown in operation 1001. During the wait precharge cycle, only a precharge is performed. No data access is performed during this cycle. Following the wait precharge cycle, a memory access cycle is performed. Because the bit lines are already precharged for the entire SRAM, no additional precharge is needed and for a sequential access, a word line firing is only needed for the first access for SRAM cells arranged along a particular row. In FIG. 10, operation 1003 "Fire WL" fires the word line in a first access cycle. A "Sense Data" operation 1005 results in the first data word Q0 appearing as valid data on the SRAM data output Q. Operation 1007 illustrates the next "Sense Data" access to another SRAM cell along the same row line. In the next access in the sequence, no word line firing is necessary because the two SRAM cells are positioned on the same row within the SRAM array. Following the Sense Data operation 1007, the second data word Q1 appears at the data output Q. Note that the two SRAM cells accessed in the sequence need not be physically adjacent so long as they are positioned along the same word line WL. However in a typical sequence of SRAM accesses the two cells can be sequentially addressed and thus, can be positioned adjacent to one another.

The operations illustrated in FIG. 10 depict an arrangement that is of particular use with pipelined systems where the data access time is fixed on a high performance cycle. In this arrangement of the present application, the clock frequency can be maximized and for these architectures a fixed memory access time Tcycnew3 can be used that is the same for each access. The precharge operation is performed as a separate operation that is done in a "wait" cycle so that the "Clk-to-Q" time is not varied, but instead is fixed for the SRAM accesses. When the clock is running at a high rate, the high performance access of FIG. 10 can be used. However, even in these high performance applications, during a power down, sleep, standby or other reduced clock rate operation, a conventional SRAM access type such as in FIG. 6 can be used, because the "clock-to-Q" time is not critical in those reduced clock rate modes of operation.

FIG. 11 depicts, in a table, an example arrangement of signals that can be used to implement the arrangements described above. However, the various methods of this application are not limited to this example implementation or any particular device architecture. In FIG. 11, an input control signal to an SRAM device is labeled "BM" for "burst mode enable." For an SRAM access, this signal indicates that a sequence of SRAM accesses will be performed so that the precharge operations, and word line firing operations, are not to be performed for each SRAM access as in the conventional SRAM accesses, but are instead to be performed according to some additional control signals. In FIG. 11, a second control input PCHF indicates, when it is active and the BM signal is also active, that the precharge should be performed only in the first half of the first access cycle in a burst mode operation. When this signal is active, it indicates to the SRAM device that the operation of FIG. 8 is to be performed, the "precharge first" mode of operation, and the word line firing, are performed for the first access to an SRAM cell in a particular row, and subsequent accesses are to be performed using only the column decoders to select the bit line pairs to be sensed by the sense amplifiers.

In FIG. 11, a third control input PCHL is also shown. During a burst mode operation, when this signal is active it indicates to the SRAM that a bit line precharge operation is to be performed in the second half of the access cycle. This operation is used in a burst mode operation to perform a "precharge last" operation such as is illustrated in FIG. 10. Following the next memory cell access, the precharge circuit is operated by the SRAM to precharge the bit line pairs to the precharge voltage. In this manner the bit line are precharged prior to an access to another different row of SRAM cells, for example.

FIG. 12 is a block diagram of an SRAM device incorporating arrangements for providing aspects of the application. In FIG. 12, the SRAM 1200 can be a stand-alone integrated circuit, or alternatively in system on a chip (SOC) applications or in other embedded memory applications, SRAM 1200 can be an embedded memory circuit included with other functional blocks on a SOC. As illustrated in FIG. 12, the SRAM 1200 has novel precharge control inputs BM, PCHF, PCHL, in addition to the address input labeled ADDRESS, input data Write Data, Read/Write Control, various power management input signals such as OFF ON, Sleep, as described above. By providing these additional control signals, the SRAM 1200 can be used to implement the novel methods that form novel arrangements for optimizing the SRAM performance that are aspects of the present application. A memory controller (not shown) that is coupled to the SRAM 1200 can signal when a precharge, and a word line firing, are needed. In a non-limiting example, when the signal BM, or burst mode enable, is inactive or low, the SRAM 1200 can operate as a conventional SRAM and the precharge and word line operations can be performed as shown in FIG. 6, above. When the burst mode enable signal BM is active, at a high voltage for example, the SRAM 1200 performs a precharge operation, and a word line firing, based on the values of the PCHF (precharge first) and PCHL (precharge last) input signals. As described above, a precharge first operation includes a precharge and a word line firing for the first SRAM cell accessed in a burst mode to a particular row, as shown in FIG. 8. A precharge last operation is indicated by the PCHL signal and causes the SRAM 1200 to perform a precharge operation following the current SRAM access, as shown in FIG. 9 for example. These signals can also be used to control the SRAM device 1200 to perform a precharge only cycle, a wait cycle as described above. The use of these signals BM, PCHF, PCHL is an example illustrating one approach to implementing the arrangements of the present application, however, this example is not limiting, and other signaling arrangements could be used. Control registers placed within the SRAM could be written to indicate what mode of operation the SRAM should perform. Serial control interfaces could be used to save pins on the SRAM 1200 to form additional arrangements, for example.

By providing the memory controller or other system devices additional control over the internal precharge operations performed by the SRAM 1200, the arrangements of the present application can advantageously operate to optimize the memory cycle times and to tailor the power consumption to the operations performed. Trade-offs can be made between data latency and SRAM power consumption. The arrangements of the present application therefore enable power to be conserved in low frequency operations, for example, while high frequency operations can be optimized to reduce the data latency or memory access times to increase performance. In the arrangements the system or memory controller can cause the SRAM to perform a stand-alone wait and precharge cycle, a precharge first at the beginning of the cycle, or a precharge last at the end of a cycle, as described above. Further, a memory controller can also direct the SRAM to perform a precharge and word line firing in a conventional access mode when performance optimization is not necessary, for example, for a random address access or for a single word access.

Figure 13:
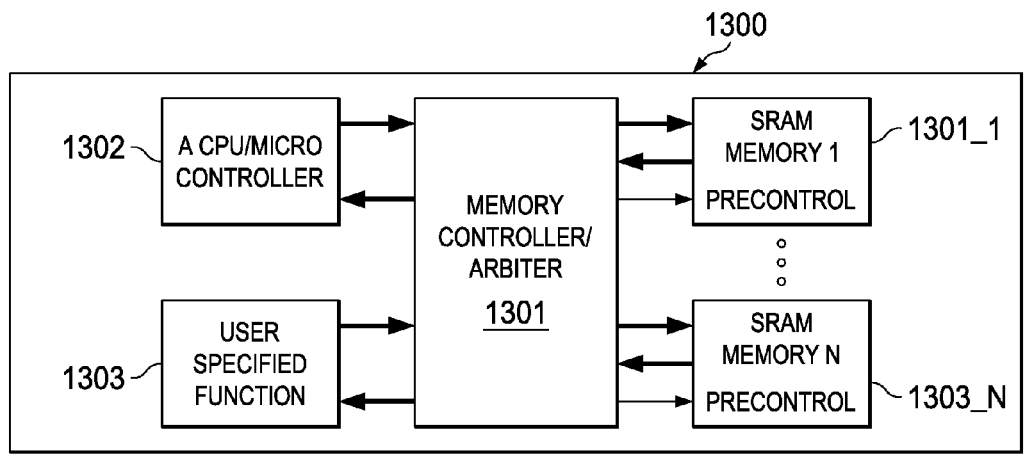
FIG. 13 is a block diagram of a system incorporating SRAM devices including aspects of the present application.

FIG. 13 is a block diagram of a system incorporating SRAM devices including aspects of the present application. In FIG. 13, a system 1300 is depicted including a memory controller and arbiter 1301 coupled to a plurality of SRAM memory devices 1303_1 to 1303_N, and a CPU/microcontroller 1302, a user specified function 1303 coupled to the memory controller 1301. In operation, a device makes a request for a memory access to the memory controller 1301. The memory controller 1301 determines whether a burst mode access is being requested and which device SRAM memory 1 to SRAM memory N is being accessed, and outputs control signals including the burst mode and precharge signals BM, PCHF and PCHL to the appropriate device. The system 1300 can be implemented on a circuit board or module using, for example, discrete integrated circuits. In additional arrangements that form additional aspects of the present application, the system 1300 can be a system on a chip (SOC) or a system in a package (SIP). Stacked die packages and other approaches to packaging integrated devices together can be used to implement system 1300.

Various operations can be performed using novel method arrangements discovered by the inventors. In a first low frequency operating mode, a READ/WRITE burst mode can be performed with no wait states. Because the clock frequency is reduced in this low frequency mode, there is no need to perform a precharge only or wait state. Table 1 below illustrates the precharge operations that can be performed between successive operations in burst mode during the low frequency operating mode.

TABLE 1

| LOW FREQUENCY OPERATIONS | FIRST BURST MODE | SECOND BURST MODE | PRE- CHARGE LAST | PRE- CHARGE FIRST |
|---|---|---|---|---|
| WRITE-READ | WRITE | READ | NONE | NONE |
| READ-WRITE | READ | WRITE | AFTER READ | OR, BEFORE WRITE |
| READ1-READ2 | READ1 | READ2 | AFTER READ1 | OR, PRIOR TO READ2 |
| WRITE1-WRITE2 | WRITE1 | WRITE2 | AFTER WRITE1 | NONE |

TABLE 1 illustrates in a first row labeled WRITE-READ the burst mode operations for a burst mode write transitioning to a burst mode read. In this transition, as shown in Table 1, there is no need for a WAIT cycle between the last write and the first read. No precharge is required for the transition.

TABLE 1 illustrates in the second row labeled READ-WRITE a burst mode operation transitioning from a burst mode read to a burst mode write. As shown in TABLE 1, the read should be followed by a precharge last, or, a precharge first should be performed prior to the first write.

The third row of TABLE 1 labeled READ1-READ2 illustrates a transition from a read operation of SRAM cells in one row to a read of SRAM cells in another row, crossing a column boundary. This transition requires a precharge at the end of the first row, with a precharge last following the last word in the READ1, or with a precharge first prior to the first read in READ2.

The last row of TABLE 1 labeled WRITE1-WRITE2 illustrates a WRITE to a first row of SRAM cells, WRITE1, transitioning to a write to a second row of SRAM cells, WRITE2. In this transition, as shown in TABLE 1, a precharge last should be performed after the last SRAM cell is written in the first row.

TABLE 2 illustrates operations in a high frequency operation burst mode. In the high frequency operation mode, wait states can be used. In the high frequency operation mode, the precharge first cycle is to be avoided, as this requires a longer cycle time for the first access in a burst of accesses. The precharge first cycle operation adds latency to the first access in a burst mode. In a high frequency operation mode, this variable access time can be advantageously avoided. Instead, a precharge only, or wait state, can be used at operation boundaries. Alternatively a precharge last option can be used to precharge the bit lines and avoid the wait cycles.

TABLE 2

| HIGH FREQUENCY OPERATIONS | FIRST BURST MODE | SECOND BURST MODE | PRECHARGE LAST | PRECHARGE FIRST | INSERT WAIT STATE |
|---|---|---|---|---|---|
| READ-READ | READ1 | READ IN SAME ROW | OPTIONAL AFTER READ | NONE | PRIOR TO BURST READ |
| UNKNOWN-READ/WRITE | UNKNOWN MODE | READ/WRITE | NONE | NONE | PRIOR TO READ OR WRITE |
| WRITE-READ | WRITE | READ | NONE | NONE | NONE |
| READ-WRITE | READ | WRITE | AFTER READ | NONE | OPTIONAL |
| READ1-READ2 | READ1 | READ2 | AFTER READ1 | NONE | AFTER READ1 |
| WRITE1-WRITE2 | WRITE1 | WRITE2 | AFTER WRITE1 | NONE | NONE |

In TABLE 2, the first row labeled READ-READ illustrates a sequential read in the same row for a burst mode read in high frequency mode. In this example, a wait cycle which is a precharge only cycle is performed prior to the first read in the burst operation. After the wait cycle, the subsequent burst read cycles do not require any additional precharge operations. At the end of the burst read cycle, a precharge last operation can optionally be performed.

In TABLE 2, the second row labeled UNKNOWN-READ/WRITE illustrates a transition from an unknown state to a read or write burst mode operation. In this transition, a wait state which is a precharge only operation is performed prior to the burst mode read or write. No precharge operation is needed after the wait state is performed. Because the state of the SRAM is unknown in the first stage, the wait cycle precharges all of the bit lines and the SRAM is then ready for burst mode operations that follow the unknown mode. This operation can be advantageously performed after a test mode, a power up, a reset, or a wake operation occurs.

In TABLE 2, the third row labeled WRITE-READ illustrates a transition from a burst mode write to a burst mode read operation. In this transition, no precharge is needed. In TABLE 2, the fourth row labeled READ-WRITE illustrates a transition from a read operation to a write operation. In performing this transition, the precharge can be performed as a wait state operation after the read is performed, or in an alternative arrangement, a precharge last can be performed after the read is performed and prior to the write operation.

In TABLE 2 the fifth row labeled READ1-READ2 illustrates a burst read mode where a first read operation in a first row, READ1, is followed by a second read operation in a second row READ2. In this transition, a wait state can be performed after the first read, or alternatively a precharge last operation can be performed after the first read. In TABLE 2, the last row labeled WRITE1-WRITE2 illustrates a write to a first row, followed by a write to a cell in another second row. In this transition, the precharge is performed as precharge last operation after the first write.

TABLE 2 illustrates that for each of the high frequency operations, a wait state or a precharge last cycle can be performed. The precharge first cycle, which would change the latency for the first SRAM access in a burst mode, is not used for the high frequency mode of operation. Instead, a wait cycle, which is a precharge only cycle, can be used. In some transitions, a precharge last operation can be performed to precharge the bit lines between transitions, instead of a wait state.

In the various arrangements that form aspects of the present application, the system is given control of the internal SRAM precharge operations in a burst mode of operation. This enables the system to make trade-offs between data latency and throughput and the power consumed. In low frequency operations, where data latency is not important, the precharge first cycle can be used. The use of the precharge first cycle delays the data in a first access by extending the clock-to-Q time in the first memory access cycle. In high frequency modes of operation, wait states can be used, which then enable the clock-to-Q time to be shortened for each of the SRAM accesses. Further the memory access cycle times in the high frequency mode can be maintained at a constant duty cycle, avoiding any variable access cycle times. In pipelined systems this aspect of the present application can be particularly advantageous.

Because the system or memory controller can determine when memory accesses are to SRAM cells in the same row, the memory controller can operate the SRAM to insert a wait state or a precharge last cycle when a transition across a column boundary (changes the row being used) is to be performed.

Figure 14:
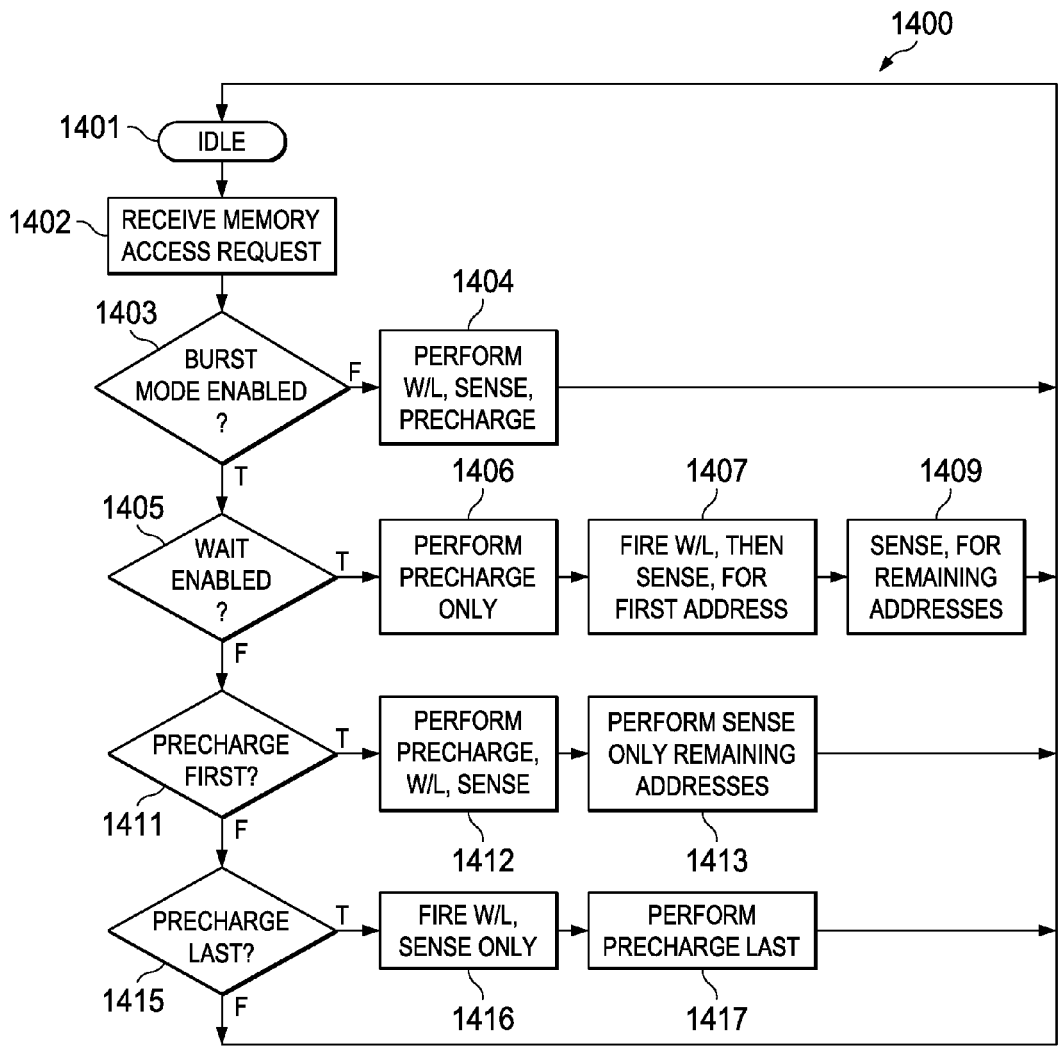
FIG. 14 is a flow diagram illustrating steps of an example method illustrating an arrangement for providing aspects of the present application.

FIG. 14 is a flow diagram illustrating steps of an example method illustrating an arrangement for providing aspects of the present application. In FIG. 14, method 1400 depicts the operations of an example memory controller and SRAM arrangement incorporating features of the present application. The method 1400 begins at step 1401 in an Idle mode. At step 1402, Receive Memory Access Request, a memory access request is received. At step 1403, Burst Mode Enabled?, a conditional test is made to determine whether the burst mode is enabled. In the example arrangements described above, this can be done by sampling the input signal BM. In FIG. 14, if the BM is not enabled, the method then transitions to step 1404 and a conventional access is performed. When the conventional SRAM access is completed the method transitions to the Idle state, 1401.

If the burst mode is enabled at step 1403, the method transitions to step 1405, Wait Enabled?. At step 1405, if the condition is true, then the method transitions to step 1406, and a precharge only cycle is performed. After the precharge only cycle is performed at step 1406, the method transitions to step 1407. At step 1407, a word line is fired, and then a sense operation is performed for the first SRAM access in a burst mode of operation. At step 1409, the remaining addresses in the burst mode are accessed using only sensing operations, and no precharge or word line firing is required.

At step 1411, a Precharge First? determination is made. If the precharge first is to be performed at step 1411, then the method transitions to step 1412. In step 1412, a first memory access cycle begins with a precharge, then a word line is fired, and a sense data operation is performed. Following the first access at step 1412, the method transitions to step 1413, where a sense data operation only is performed for the remaining SRAM cell addresses in the burst mode of operations. The method then transitions back to step 1401, Idle.

At step 1415, a determination is made whether a Precharge Last? operation is to be performed. If the condition is false, the method transitions back to state 1401, Idle. If the condition at step 1415 is true, the method transitions to step 1416, and a word line is fired in the first access cycle, followed by sense data operations for each of the remaining addresses in the burst operation. After the last SRAM cell is accessed in the burst in state 1416, a precharge last operation is performed at step 1417. The method then transitions back to state 1401, or Idle.

FIG. 14 depicts an example arrangement for performing certain methods of the present application. Various modifications can also be made in the order of steps and in the number of steps to form additional novel arrangements that incorporate aspects of the present application, and these modifications will form additional alternative arrangements that are contemplated by the inventors as part of the present application and which fall within the scope of the appended claims.

Although the example illustrative arrangements have been described in detail, it should be understood that various changes, substitutions and alterations can be made herein without departing from the spirit and scope of the present application as defined by the appended claims.

Moreover, the scope of the present application is not intended to be limited to the particular illustrative example arrangements of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

What is claimed is:

1. A circuit for data storage, comprising:
a static random access memory (SRAM) circuit operable to store data in an array of SRAM cell circuits arranged in rows and columns, each SRAM cell circuit coupled to one of a plurality of word lines disposed along the rows of SRAM cell circuits, and each SRAM cell coupled to a pair of complementary bit lines disposed along the columns of SRAM cells circuits, the SRAM cell circuits each operable to output a differential voltage corresponding to a stored datum on the corresponding pair of complementary bit lines responsive to a row select voltage on the word line coupled to the SRAM cell circuit, and one or more precharge circuits in the SRAM circuit coupled to one or more pairs of the complementary bit lines and operable to charge the pairs of complementary bit lines to a precharge voltage, responsive to a precharge control signal; and a memory controller circuit external to and coupled to the SRAM circuit and operable to control read and write data accesses to the SRAM circuit by outputting one or more precharge control signals to the SRAM circuit;

wherein the precharge control signal within the SRAM circuit is operable to cause coupling transistors within the precharge circuits of the SRAM circuit to couple a pair of complementary bit lines to the precharge voltage, responsive to the precharge control signals output from external memory controller circuit indicating a bitline precharge is to be performed;

wherein the memory controller circuit further comprises precharge mode control circuitry operable to output: a burst mode enable signal to the SRAM circuit indicating that a next memory address to be accessed is to a memory cell along the same row as the current row corresponding to the current address input to the SRAM circuit; a precharge first mode signal to the SRAM circuit when a sequence of SRAM memory accesses will occur along the same row of SRAM cells; and a precharge last mode signal to the SRAM circuit when a sequence of SRAM memory accesses will occur that requires access to a row of SRAM cells that differs from the row of SRAM cells that is currently being accessed.

2. The circuit for data storage of claim 1, wherein the SRAM circuit further comprises:
bitline precharge circuitry operable to couple the bit lines in the SRAM memory to a precharge voltage prior to each memory access in a conventional mode, the bitline precharge circuitry responsive to a first state on the burst mode enable signal.

3. The circuit for data storage of claim 1, wherein the SRAM circuit further comprises:
bitline precharge circuitry operable to couple the bit lines in the SRAM memory to the precharge voltage during a first access to SRAM cells along a selected word line, and operable to not couple the bit lines to the precharge voltage during subsequent accesses along a selected word line, responsive to a second state on the burst mode enable signal.

4. A circuit for data storage, comprising:
a static random access memory (SRAM) circuit operable to store data in an array of SRAM cell circuits arranged in rows and columns, each SRAM cell circuit coupled to one of a plurality of word lines disposed along the rows of SRAM cell circuits, and each SRAM cell coupled to a pair of complementary bit lines disposed along the columns of SRAM cells circuits, the SRAM cell circuits each operable to output a differential voltage corresponding to a stored datum on the corresponding pair of complementary bit lines responsive to a row select voltage on the word line coupled to the SRAM cell circuit, and one or more precharge circuits in the SRAM circuit coupled to one or more pairs of the complementary bit lines and operable to charge the pairs of complementary bit lines to a precharge voltage, responsive to a precharge control signal; and a memory controller circuit external to and coupled to the SRAM circuit and operable to control read and write data accesses to the SRAM circuit by outputting one or more precharge control signals to the SRAM circuit;

wherein the precharge control signal within the SRAM circuit is operable to cause coupling transistors within the precharge circuits of the SRAM circuit to couple a pair of complementary bit lines to the precharge voltage, responsive to the precharge control signals output from external memory controller circuit indicating a bitline precharge is to be performed;

wherein the memory controller circuit further comprises high frequency precharge mode control circuitry operable to output precharge control signals to the SRAM circuit when a clocking frequency over a predetermined threshold is detected.

5. The circuitry for data storage of claim 4, wherein the SRAM circuit further comprises:

an address input operable for receiving an address indicating one or more particular SRAM cells are to be accessed;

a read/write input operable for receiving a read/write control signal indicating whether an access to the SRAM circuit is a read or a write access;

a data input operable for receiving write data to be written into one or more SRAM cells within the SRAM circuit;

a data output signal operable for outputting read data retrieved from one or more cells within the SRAM circuit;

a row decoder circuit operable for receiving a portion of the address input and outputting a row select voltage on one of the plurality of word lines for a selected row of SRAM cells that is indicated by the portion of the address input;

a column decoder circuit operable for decoding a second portion of the address input and outputting Y-select signals corresponding to a column of SRAM cells indicated by the second portion of the address input; and a column select multiplexer operable for receiving the Y-select signals and operable to couple a pair complementary bit lines corresponding to the column indicated by the second portion of the address input signal to one of a plurality of sense amplifiers, the sense amplifiers each operable to sense a differential voltage present on the pair of complementary bit lines and to amplify the differential voltage and further operable to output a logic level voltage to the data output signal.

6. The circuit for data storage of claim 4, wherein the high frequency precharge mode control circuitry in the memory controller circuit is further operable to output a precharge only cycle control signal to the SRAM circuit.

7. The circuit for data storage of claim 4, wherein the memory controller circuit further comprises low frequency precharge control circuitry operable to output signals for controlling precharge cycles in the SRAM circuit when a clock signal has a frequency lower than a predetermined threshold.

8. The circuit for data storage of claim 7, wherein the low frequency precharge control circuitry is further operable to output a burst mode enable signal indicating a sequence of memory accesses to SRAM cells in the SRAM circuit along a same row and coupled to a same word line in the SRAM circuit.

9. The circuit for data storage of claim 8 wherein the low frequency precharge control circuitry is further operable to output a precharge first control signal to the SRAM circuit indicating a bitline precharge is to be performed by the SRAM circuit for the first memory access in a sequence of memory accesses.

10. A method operating a static random access memory (SRAM) device, the method comprising:

providing an array of SRAM cells arranged in rows and columns, each SRAM cell operable to store a datum, each SRAM cell coupled to one of a plurality of word lines arranged along the rows of SRAM cells, and each SRAM cell further coupled to a pair of complementary bit lines arranged along the columns of SRAM cells;

providing a precharge circuit coupled to each of the pairs of complementary bitlines, the precharge circuit operable to couple the corresponding pair of complementary bitlines to a precharge voltage, responsive to a precharge control signal;

in a conventional mode, operating the precharge circuit using the precharge control signal each time an access is performed to one or more of the SRAM cells;

in a burst mode, operating the precharge circuit only one time during a burst access to a plurality of the SRAM cells, the burst access further comprising a series of accesses to SRAM cells in the array of SRAM cells that are arranged along a same row; and in a wait cycle mode, operating the precharge circuit for a memory cycle while no accesses are performed.

11. The method of claim 10, wherein in the burst mode, the precharge circuit is operated once prior to a first SRAM cell access in the series of accesses.

12. The method of claim 10, wherein in the burst mode, the precharge circuit is operated once following a last SRAM cell access in the series of accesses.

13. The method of claim 10, wherein in the burst mode, a wordline is activated once prior to a first SRAM cell access in the series of accesses.

14. An integrated circuit, comprising:

a static random access memory (SRAM) circuit, comprising a plurality of SRAM storage cell circuits each operable to store a datum and arranged in rows and columns, a plurality of word lines arranged along the rows of SRAM cells and coupled to the SRAM cells in the corresponding row, a plurality of complementary bit line pairs arranged along the columns of SRAM cells and coupled to the SRAM cells along the columns, and a precharge circuit coupled to each of the pairs of complementary bit lines operable for coupling a precharge voltage to the pair complementary bit lines, responsive to a precharge control signal; and a memory controller circuit external to and coupled to the SRAM circuit and operable to output control signals to the SRAM circuit, the memory controller circuit operable to output the precharge control signal once for each access to the SRAM circuit in a conventional mode of operation, and operable to output the precharge control signal once for a series of accesses to the SRAM circuit in a burst mode of operation;

wherein the memory controller circuit further comprises a burst mode controller operable to output the precharge control signal during a series of accesses to the SRAM circuit when the memory controller circuit detects a change in the row of SRAM cells selected in the SRAM circuit.

15. The integrated circuit of claim 14, and further comprising:

at least one programmable processor operable to execute instructions to perform a user specified function, and operable to read and write data to and from the SRAM circuit, the programmable processor coupled to the memory controller circuit.

16. The integrated circuit of claim 15, wherein the integrated circuit further comprises a radio transceiver circuit configured to transmit and receive data over an over the air interface.

17. The integrated circuit of claim 16, wherein the integrated circuit further comprises one or more sensor circuits for receiving data responsive to a sensed condition.

18. An integrated circuit, comprising:
a static random access memory (SRAM) circuit, comprising a plurality of SRAM storage cell circuits each operable to store a datum and arranged in rows and columns, a plurality of word lines arranged along the rows of SRAM cells and coupled to the SRAM cells in the corresponding row, a plurality of complementary bit line pairs arranged along the columns of SRAM cells and coupled to the SRAM cells along the columns, and a precharge circuit coupled to each of the pairs of complementary bit lines operable for coupling a precharge voltage to the pair complementary bit lines, responsive to a precharge control signal; and
a memory controller circuit external to and coupled to the SRAM circuit and operable to output control signals to the SRAM circuit, the memory controller circuit operable to output the precharge control signal once for each access to the SRAM circuit in a conventional mode of operation, and operable to output the precharge control signal once for a series of accesses to the SRAM circuit in a burst mode of operation;
wherein the memory controller circuit further comprises a burst mode controller operable to output the precharge control signal prior to an access of an SRAM cell in the SRAM circuit following a power up of the integrated circuit.

* * * * *